(12) United States Patent
Shin et al.

(10) Patent No.: US 12,019,495 B2
(45) Date of Patent: Jun. 25, 2024

(54) POWER SUPPLY APPARATUS AND METHOD AND STORAGE SYSTEM INCLUDING THE SAME

(71) Applicant: SK hynix Inc., Gyeonggi-do (KR)

(72) Inventors: Woong Sik Shin, Gyeonggi-do (KR); Seong Chan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 56 days.

(21) Appl. No.: 18/073,676

(22) Filed: Dec. 2, 2022

(65) Prior Publication Data

US 2023/0384851 A1 Nov. 30, 2023

(30) Foreign Application Priority Data

May 24, 2022 (KR) .................... 10-2022-0063482

(51) Int. Cl.
*G06F 1/32* (2019.01)
*G06F 1/3206* (2019.01)
*G06F 1/3234* (2019.01)

(52) U.S. Cl.
CPC .......... *G06F 1/3206* (2013.01); *G06F 1/3275* (2013.01)

(58) Field of Classification Search
CPC ............................ G06F 1/3206; G06F 1/3275
See application file for complete search history.

(56) References Cited

U.S. PATENT DOCUMENTS

| 6,191,499 B1* | 2/2001 | Severson ................. G06F 1/26 307/31 |
| 10,706,943 B2 | 7/2020 | Kim et al. |
| 2002/0087906 A1* | 7/2002 | Mar ........................ G06F 1/305 713/330 |
| 2023/0019075 A1* | 1/2023 | Seok ........................ G06F 1/30 |

FOREIGN PATENT DOCUMENTS

KR 10-2019-0089268 A 7/2019

* cited by examiner

*Primary Examiner* — Stefan Stoynov
(74) *Attorney, Agent, or Firm* — IP & T GROUP LLP

(57) ABSTRACT

A power supply apparatus may include a power management circuits, a switch circuit and a power controller. The power controller configured to sequentially drive the power management circuits in accordance with a drive sequence, and control the switch circuit to apply, to the output terminals, the output voltage of a normally operated power management circuit as the driven power management circuit among the power management circuits.

15 Claims, 8 Drawing Sheets

POWER SUPPLY APPARATUS AND METHOD AND STORAGE SYSTEM INCLUDING THE SAME

CROSS-REFERENCES TO RELATED APPLICATION

The present application claims priority under 35 U.S.C. § 119(a) to Korean application number 10-2022-0063482, filed on May 24, 2022, which is incorporated herein by reference in its entirety.

BACKGROUND

1. Technical Field

Various embodiments of the present disclosure generally relate to an electronic device, more particularly, to an apparatus and a method of supplying power and a storage system including the apparatus.

2. RELATED ART

An electronic device may include a power management circuit configured to convert a power voltage supplied from an external device into internal voltage having a level required for operating internal circuits. The power management circuit may then provide the internal circuits with the internal voltages.

The at least one power management circuit may be provided to each of the internal circuits. The power management circuit may supply power to the internal circuits in booting the electronic device.

The internal voltage may be supplied to all internal circuits so that the electronic device may be normally operated. Thus, the normal operation of the electronic device may be determined in accordance with quality of the power management circuit.

SUMMARY

According to various embodiments of the present disclosure, there may be provided a power supply apparatus. The power supply apparatus may include a power management circuits configured to receive an external power voltage to generate an output voltage having a same level or different levels respectively; a switch circuit electrically connected between the power management circuits and output terminals, a number of the output terminals being less than a number of the power management circuits; and a power controller configured to sequentially drive the power management circuits in accordance with a drive sequence, and control the switch circuit to apply, to the output terminals, the output voltage of a normally operated power management circuit as the driven power management circuit among the power management circuits.

According to various embodiments of the present disclosure, there may be provided a power supply method. The power supply method may include providing power management circuits, a number of the power management circuits being greater than a number of output terminals; sequentially driving the power management circuits in accordance with a drive sequence; generating an output voltage from a normally operated power management circuit as the driven power management circuit among the power management circuits, and applying the output voltage to the output terminals.

According to various embodiments of the present disclosure, there may be provided a storage system. The storage system may include at least one memory device; a controller configured to exchange data with the memory device in response to a request from an external device; output terminals to which a plurality of internal circuits including the memory device and the controller are electrically connected; and a power supply apparatus configured to sequentially drive power management circuits, which receives a power voltage from the external device to generate an output voltage having a same level or different levels respectively, and apply, to the output terminals, the output voltage of a normally operated power management circuit as the driven power management circuits, a number of the power management circuits being greater than a number of the output terminals.

According to various embodiments of the present disclosure, there may be provided a power supply apparatus. The power supply apparatus may include a first power management circuit selectively activated to generate first and second output voltages; first and second switches selectively activated to transfer the first and second output voltages to first and second output nodes, respectively; a second power management circuit selectively activated to generate the second output voltage; a third switch selectively activated to transfer the second output voltage from the second power management circuit to the second output node; and a power controller configured to selectively activate each of the first and second power management circuits and the first to third switches such that: the first and second output voltages generated from the respective first and second power management circuits are output to the respective first and second output nodes, or the second output voltage generated from one of the first and second power management circuits is output to the second output node.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments of the present disclosure will be described in greater detail with reference to the accompanying drawings. The drawings are schematic illustrations of various embodiments and intermediate structures. As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present invention is described herein with reference to cross-section and/or plan illustrations of embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
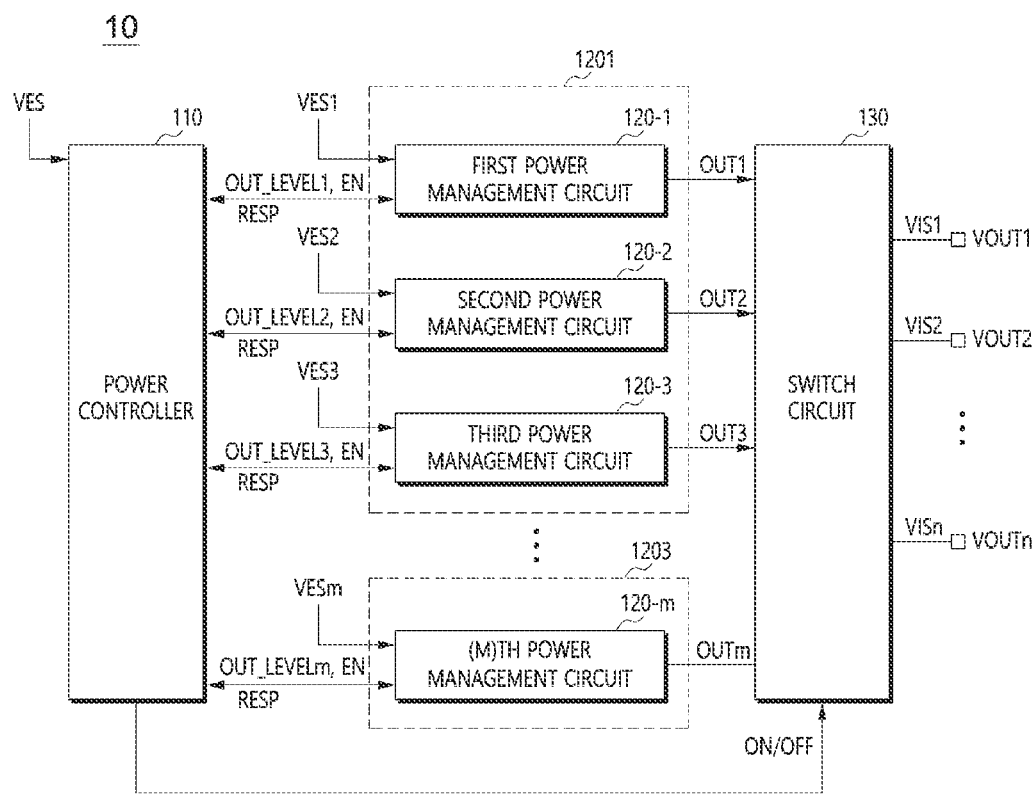
FIG. 1 is a view illustrating a power supply apparatus in accordance with an embodiment of the present disclosure.

FIG. 1 is a view illustrating a power supply apparatus in accordance with an embodiment of the present disclosure.

Referring to FIG. 1, a power supply apparatus 10 may include a power controller 110, a plurality of power management circuits 120-1 to 120-*m* and a switch circuit 130.

The power controller 110 may receive an external power voltage VES0. The power controller 110 may control the power management circuits 120-1 to 120-*m* and the switch circuit 130.

Each of the power management circuits 120-1 to 120-*m* may receive external power voltages VES1 to VESm having a same level or different levels. Each of the power management circuits 120-1 to 120-*m* may convert the level of the external power voltages VES1 to VESm in accordance with controls of the power controller 110 to generate output voltages OUT1 to OUTm having a same level or different levels.

The switch circuit 130 may apply the output voltages OUT1 to OUTm of the power management circuits 120-1 to 120-*m* as internal voltages VIS1 to VISn to corresponding output terminals VOUT1 to VOUTn in accordance with the controls of the power controller 110.

Hereinafter, operations of the power supply apparatus 10 are illustrated in detail.

When a power supply process may be initiated, the power controller 110 may drive all or a part of the power management circuits 120-1 to 120-*m* in accordance with a predetermined drive sequence.

In various embodiments, the power controller 110 may store the drive sequence with respect to each of the power management circuits 120-1 to 120-*m*. The power controller 110 may transmit target voltage levels OUT_LEVEL1 to OUT_LEVELm to the power management circuits 120-1 to 120-*m* in turn based on the drive sequence. The power controller 110 may transmit an enable signal EN to the power management circuits 120-1 to 120-*m* as the driven object. The power controller 110 may receive a response signal RESP with respect to the enable signal EN to determine whether the power management circuits 120-1 to 120-*m* may be normally operated or not. The power controller 110 may be electrically connected with each of the power management circuits 120-1 to 120-*m* through an interface based on a system management bus (SMBus) protocol, an inter-integrated circuit (I2C) protocol, an improved inter-integrated circuit (I3C) protocol, etc.

The power management circuits 120-1 to 120-*m* may receive the external power voltages VES1 to VESm having a same level or different levels to generate the output voltages OUT1 to OUTm having the target voltage levels OUT_ILEVEL1 to OUT_ILEVELm set by the power controller 110, Each of the power management circuits 120-1 to 120-*m* may transmit the response signal RESP with respect to the enable signal EN of the power controller 110. The power controller 110 may determine whether the power management circuits 120-1 to 120-*m* may be normally operated or not based on the reception of the response signal RESP.

The switch circuit 130 may apply the output voltages OUT1 to OUTm, which may be generated from the normally operated the power management circuits 120-1 to 120-*m*, to the corresponding output terminals VOUT1 to VOUTn by sequentially driving the power management circuits 120-1 to 120-*m* in accordance with the drive sequence. An electronic device, which may receive a voltage from the power controller 10, may be electrically connected to the output terminals VOUT1 to VOUTn, Each of internal circuits may be electrically connected to the at least one output terminals VOUT1 to VOUTn to receive the internal voltages VIS1 to VISn applied to the output terminals VOUT1 to VOUTn.

The power controller 110 may control the switch circuit 130 in accordance with the normal operation of the power management circuits 120-1 to 120-*m*. In various embodiments, the power controller 110 may control the switch circuit 130 so that the output voltages OUT1 to OUTm of the normal power management circuits may be applied to 120-1 to 120-*m* to the output terminals VOUT1 to VOUTn and the output voltages OUT1 to OUTm of the abnormal power management circuits 120-1 to 120-*m* may not be applied to the switch circuit 130.

In various embodiments, a number of the power management circuits 120-1 to 120-*m* may be greater than a number of the output terminals VOUT1 to VOUTn. That is, the number "m" may be greater than the number "n". When a number of the normally operated power management circuits 120-1 to 120-*m* may have become to the number of the output terminals VOUT1 to VOUTn in accordance with the drive sequence, i.e., the internal voltages VIS1 to VISn may be applied to all output terminals VOUT1 to VOUTn, the power supply process may be terminated.

When the number of the power management circuits 120-1 to 120-*m*, which may be required for all internal circuits in the electronic device to which the voltage may be applied from the power supply apparatus 10, may be 'n' (where 'n' is a natural number), that is, the number of the output terminals VOUT1 to VOUTn may be 'n', the power supply apparatus 10 may include the number 'm' of the power management circuits 120-1 to 120-*m*, Here, the 'm' is greater than the 'n'. In an embodiment, the number 'n' of the power management circuits among all power management circuits 120-1 to 120-*m* may be referred to as a normal power management circuit 1201. Further, remaining power management circuits 120-1 to 120-*m* among all power management circuits 120-1 to 120-*m* may be referred to as a preliminary power management circuit 1203.

According to various embodiments, the power supply apparatus 10 may include the power management circuits 120-1 to 120-*m* more than the output terminals VOUT1 to VOUTn. Thus, the power controller may drive the power management circuits 120-1 to 120-*m* in accordance with the drive sequence, when the abnormal power management circuit may be detected. However, the detected abnormal power management circuit may be negligible. The negligible power management circuit may not be used. In contrast, the negligible power management circuit may be replaced by a next normal power management circuit, FIG. 2 is a view illustrating a power controller in accordance with an embodiment of the present disclosure.

Figure 2:
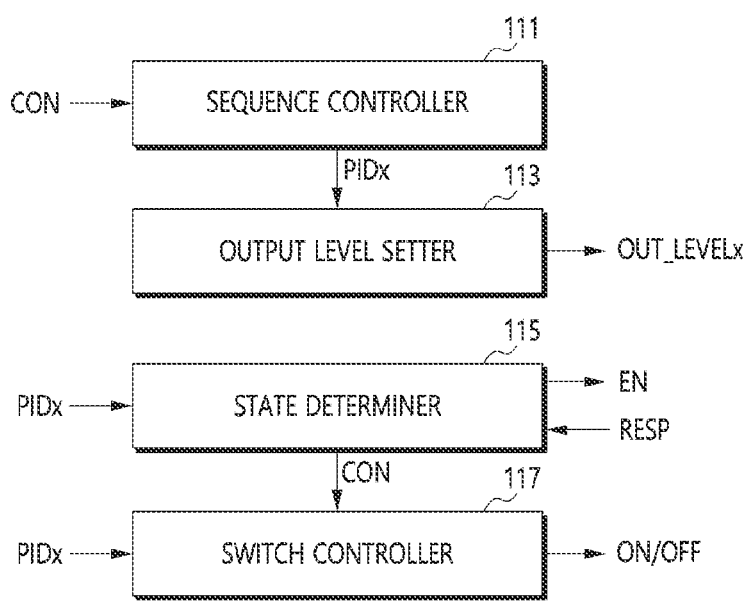
FIG. 2 is a view illustrating a power controller in accordance with an embodiment of the present disclosure.

Referring to FIG. 2, the power controller 110 may include a sequence controller 111, an output level setter 113, a state determiner 115 and a switch controller 117.

Each of the plurality of power management circuits 120-1 to 120-*m* may be assigned a unique identifier $PID_x$. The sequence controller 111 may store the drive sequence with respect to each of the power management circuits 120-1 to 120-*m*. The sequence controller 111 may output an identification $PID_x$ of in turn to be driven among the power management circuits 120-1 to 120-*m* in response to a sequence control signal CON when the sequence control signal CON is enabled.

The output level setter 113 may provide the power management circuits 120-1 to 120-*m* indicated by the identification $PID_x$ with the target voltage levels OUT_LEVELS1 to OUT_LEVEILSx (where x is a natural number within a range of 1≤x≤m).

The state determiner 115 may transmit the enable signal EN to the power management circuits 120-1 to 120-*m* indicated by the identification $PID_x$. The state determiner 115 may determine, based on the response signal RESP transmitted from the power management circuits 120-1 to 120-*m*, whether the power management circuits 120-1 to 120-*m* may be normally operated or not. The state determiner 115 may determine that the power management circuits 120-1 to 120-*m* operates normally when the response signal RESP is transmitted in response to the enable signal EN and may output the sequence control signal CON. The sequence control signal CON is provided to the sequence controller 111 to drive the power management circuits 120-1 to 120-*m* next in turn.

The switch controller 117 may operate according to the identification $PID_x$ of the power management circuits 120-1 to 120-*m* and the sequence control signal CON, and generate a switch control signal ON/OFF. The switch controller 117 may transmit the switch control signal ON/OFF to the switch circuit 130. In example embodiments, the switch controller 117 may output an ON signal or an OFF signal according to whether the sequence control signal CON is activated.

In example embodiments, the power management circuits 120-1 to 120-*m* are in turn driven to transmit the response signal REPS, when the sequence control signal CON is activated, it is determined that the power management circuits 120-1 to 120-*m* may be normally operated. Accordingly, the switch controller 117 may control the switch circuit 130 to apply the output voltages OUT1 to OUTm to the output terminals VOUT1 to VOUTn. In contrast, when the power management circuits 120-1 to 120-*m* may be abnormal, e.g., when the sequence control signal CON is inactivated, the switch controller 117 may control the switch circuit 130 so that the output voltages OUT1 to OUTm may not be applied to the output terminals VOUT1 to VOUTn. When the internal voltages VIS1 to VIS3 may be supplied to all output terminals VOUT1 to VOUT3, the power management circuit in standby state that has not yet been driven is not driven and the power supply process is terminated.

Figure 3:
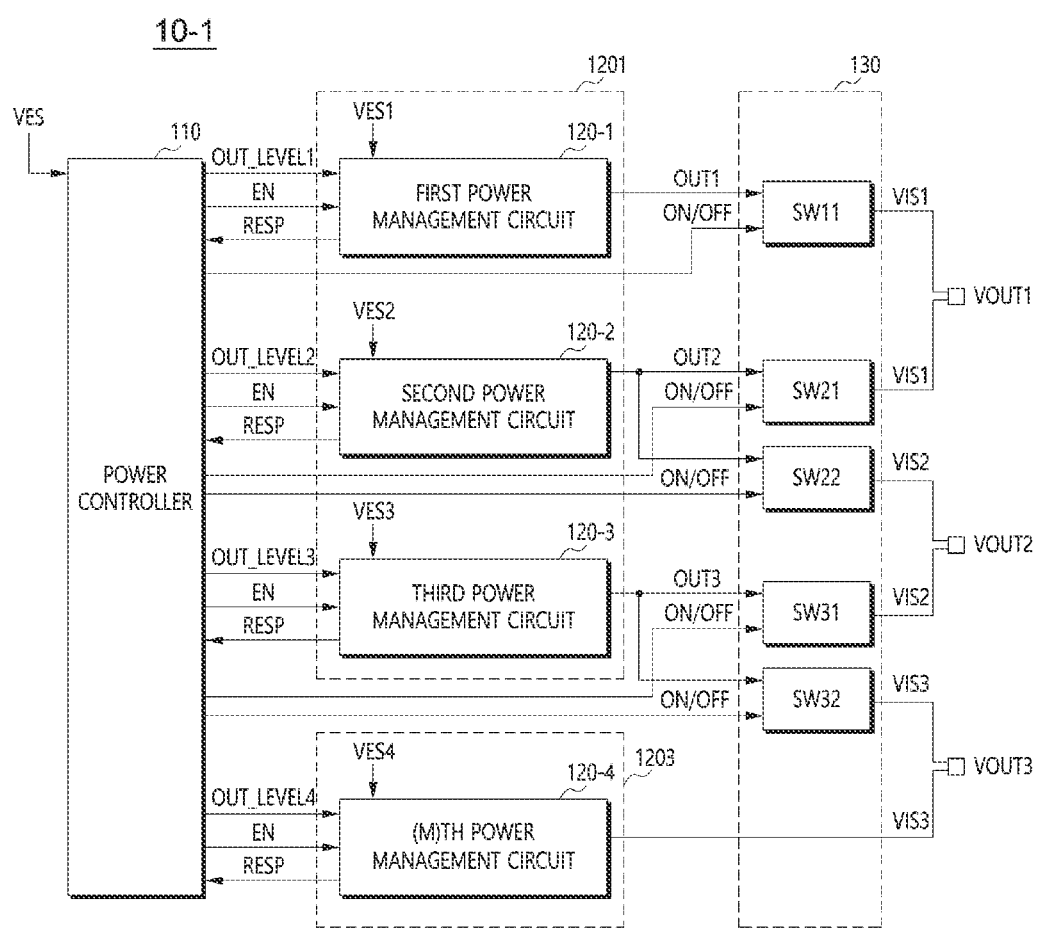
FIG. 3 is a view illustrating an operation of a power supply apparatus in accordance with an embodiment of the present disclosure.

FIG. 3 is a view illustrating an operation of a power supply apparatus in accordance with an embodiment of the present disclosure.

FIG. 3 shows a power supply apparatus 10-1 including three normal power management circuits 1201 and one preliminary power management circuits 1203 configured to supply voltages three output terminals VOUT1 to VOUTn.

A power supply process having a drive sequence in which the first power management circuit 120-1, the second power management circuit 120-2, the third power management circuit 120-3 and the fourth power management circuit 120-4 may be sequentially stored, may be illustrated in detail.

In order to drive the first power management circuit 120-1, the power controller 110 may provide the first power management circuit 120-1 with a target voltage level OUT_LEVEL1. When the first power management circuit 120-1 may be normally operated, the first power management circuit 120-1 may convert an external power voltage VES1 in accordance with the target voltage level OUT_LEVEL1 to generate an output voltage OUT1.

The power controller 110 may transmit the enable signal EN to the first power management circuit 120-1 and receive the response signal RESP with respect to the transmitted enable signal EN. When the first power management circuit 120-1 may be normally operated, the response signal RESP may be transmitted to the power controller 110. In contrast, when the first power management circuit 120-1 may not be normally operated, the response signal RESP may not be transmitted to the power controller 110.

When the first power management circuit 120-1 may be normally operated, the power controller 110 may generate a switch control signal ON/OFF to control a switch SW11, thereby applying the output voltage OUT1 of the first power management circuit 120-1 to a first output terminal VOUT1.

In contrast, when the first power management circuit 120-1 may not be normally operated, the power controller 110 may generate a switch control signal ON/OFF to control a switch SW11 so that the output voltage OUT1 of the first power management circuit 120-1 may not be applied to the first output terminal VOUT1, Thus, a first internal circuit coupled to the first output terminal VOUT1 may not receive a first internal voltage VIS1.

The power controller 110 may drive the second power management circuit 120-2 in accordance with the drive sequence. The power controller 110 may control the switch circuit 130 in accordance with the normal operation of the previous first power management circuit 120-1 and the normal operation of the next second power management circuit 120-2.

In various embodiments, when the second power management circuit 120-2 may be normally operated after normally operating the first power management circuit 120-1, the power controller 110 may control switches SW21 and SW22 to apply an output voltage OUT2 of the second power management circuit 120-2 as an internal voltage VIS2 to a second output terminal VOUT2. For example, the switch SW21 may be turned-off and the switch SW22 may be turned-on.

The power controller 110 may drive the third power management circuit 120-3 in accordance with the drive sequence. When the third power management circuit 120-3 may be normally operated, an output voltage OUT3 of the third power management circuit 120-3 as an internal voltage VIS3 may be applied to an output terminal VOUT3. Because the internal voltages VIS1 to VIS3 may be supplied to all output terminals VOUT1 to VOUT3, the power controller 110 may terminate the power supply process. In contrast, when the third power management circuit 120-3 may not be normally operated, the power controller 110 may drive the fourth power management circuit 120-4.

In various embodiments, when the first power management circuit 120-1 may be determined to be abnormal and the second power management circuit 120-2 may be normally operated, the power controller 110 may control the switches SW21 and SW22 to apply the output voltage OUT2 of the second power management circuit 120-2 as the internal voltage VIS1 to the first output terminal VOUT1. For example, the switch SW21 may be turned-on and the switch SW22 may be turned-off. That is, when the first power management circuit 120-1 may be determined to be abnormal, the power controller 110 may control the second power management circuit 120-2 to generate the output voltage OUT2 having the first target voltage level OUT_LEVEL1.

The power controller 110 may drive the third power management circuit 120-3 in accordance with the drive sequence. The turn-on/turn-off of the switches SW31 and SW32 coupled to the third power management circuit 120-3 may be controlled in accordance with the normal operation of the previous second power management circuit 120-2 and the normal operation of the next third power management circuit 120-3.

In various embodiments, when the second power management circuit 120-2 may be determined to be abnormal after normally operating the first power management circuit 120-1, the power controller 110 may control the switches SW21 and SW22 to not use the output voltage OUT2 of the second power management circuit 120-2. For example, the switch SW21 and SW22 may be turned-off. The power controller 110 may drive the third power management circuit 120-3 in accordance with the drive sequence and control the switch circuit 130.

Similarly, a m-th power management circuit 120-m may be controlled in accordance with a normal operation of a (m−1)-th power management circuit and the m-th power management circuit 120-m. For example, the fourth management circuit 120-4 may be the m-th power management circuit 120-m driven just after the third power management circuit 120-3, as illustrated in FIG. 3. When the internal voltage VIS3 may be applied to the third output terminal VOUT3 by the third power management circuit 120-3, the power controller 110 may not drive the fourth power management circuit 120-4. In contrast, when the internal voltage VIS3 may not be applied to the third output terminal VOUT3 by the third power management circuit 120-3, the power controller 110 may control the switch circuit 130 to apply an output voltage of the fourth power management circuit 120-4 to the third output terminal VOUT3. In various embodiments, the switch circuit 130 may transfer the output voltage of the fourth power management circuit 120-m to the third output terminal VOUT3.

During the above-mentioned process, all or a part of the power management circuits 120-1, 120-2, 120-3 and 120-4 may be sequentially driven to apply the internal voltages VIS1 to VIS3 to all output terminals VOUT1 to VOUT3.

Figure 4:
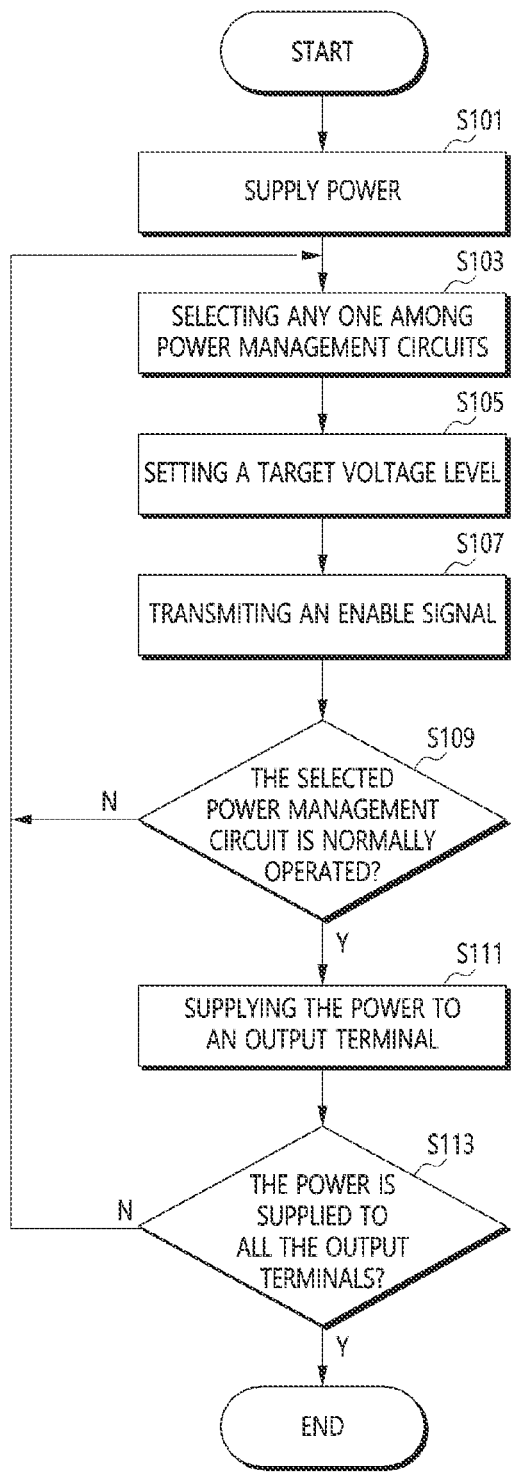
FIG. 4 is a flow chart illustrating a power supply method in accordance with an embodiment of the present disclosure.

FIG. 4 is a flow chart illustrating a power supply method in accordance with an embodiment of the present disclosure.

Referring to FIG. 4, in operation S101, the power supply apparatus 10 may initiate the power supply process by supplying of the external power voltage in operation S101.

In operation S103, the power supply apparatus 10 may select one of the power management circuits based on the drive sequence with respect to the power management circuits.

In operation S105, the power supply apparatus 10 may set the target voltage level of the selected power management circuit.

In operation S107, the power supply apparatus 10 may transmit the enable signal to the selected power management circuit.

In operation S109, the power supply apparatus 10 may determine whether the selected power management circuit may be normally operated or not in accordance with the transmission of the response signal with respect to the enable signal by the selected power management circuit.

When the selected power management circuit may be normally operated in operation S109:Y, in operation Sill, the power supply apparatus 10 may apply the output voltage of the corresponding power management circuit to the output terminal.

When the power may be supplied to all output terminals in operation S113:Y, the power supply apparatus 10 may terminate the power supply process.

When the selected power management circuit may be abnormally operated in operation S109:N and an output terminal to which the power may not be supplied may remain in operation S113:N, the power supply apparatus 10 may select a next power management circuit in accordance with the drive sequence. The power supply apparatus 10 may perform the above-mentioned processes in operation S103.

Figure 5:
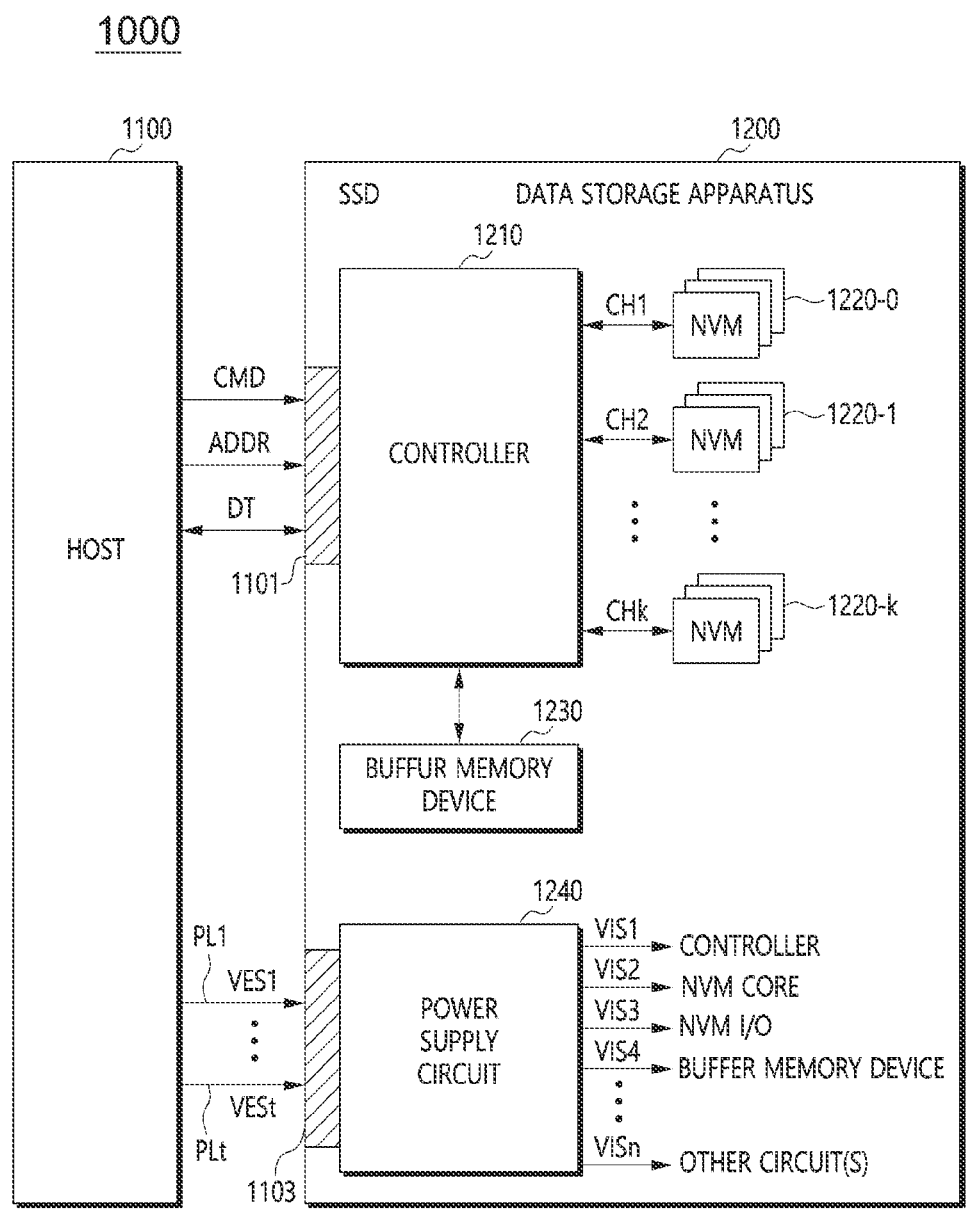
FIG. 5 is a view illustrating a storage system in accordance with an embodiment of the present disclosure.

FIG. 5 is a view illustrating a storage system in accordance with an embodiment of the present disclosure.

Referring to FIG. 5, a storage system 1000 may include a host device 1100 and a data storage device 1200. In various embodiments, the data storage device 1200 may include a solid state drive (SSD).

The data storage device 1200 may include a controller 1210, non-volatile memory devices 1220-0 to 1220-n, a buffer memory device 1230, a power supplier 1240, a signal connector 1101 and a power connector 1103.

The controller 1210 may control operations of the data storage device 1200, The controller 1210 may include a host interface circuit, a control circuit, a random access memory as an operation memory, an error correction code (ECC) circuit and a memory interface circuit.

The data storage device 1200 may receive a command signal CMD and an address signal ADDR through the signal connector 1101. The data storage device 1200 may receive and transmit data from/to the host device 1100 through the signal connector 1101, The signal connector 1101 may include various connectors in accordance with interface types between the host device 1100 and the data storage device 1200.

The controller 1210 may analyze and process a signal inputted from the host device 1100, The controller may control background-functioned blocks in accordance with a firmware or a software for driving the data storage device 1200.

The buffer memory device 1230 may temporarily store data stored in the non-volatile memory devices 1220-0 to 1220-n. The buffer memory device 1230 may temporarily store data read from the non-volatile memory devices 1220-0 to 1220-n. The data temporarily stored in the buffer memory device 1230 may be transmitted to the host device 1100 or the non-volatile memory devices 1220-0 to 1220-n in accordance with controls of the controller 1210.

The non-volatile memory devices 1220-0 to 1220-n may be used as a storage medium of the data storage device 1220. Each of the non-volatile memory devices 1220-0 to 1220-n may be connected with the controller 1210 through a plurality of channels CH0 to CHk. The at least one non-volatile memory device may be connected to one channel. The non-volatile memory devices connected to one channel may be connected to a same signal bus and a same data bus.

The power supplier 1240 may convert levels of the external power voltages VES1 to VESm, which may be inputted through the power connector 1103 including a plurality of power lines PIA to PLt, to generate the internal voltages VIS1 to VISn. The internal voltages VIS1 to VISn generated from the power supplier 1240 may be provided to the controller 1210, memory cell arrays NVM Core and input/output circuits NVM I/O of the non-volatile memory devices 1220-0 to 1220-n, the buffer memory device 1230 and other circuits. The power supplier 1240 may include an auxiliary power supplier 1241. When a sudden power off may be generated, the auxiliary power supplier 1241 may supply power to the data storage device 1200 to normally stop the data storage device 1200. The auxiliary power supplier 1241 may include high-capacitated capacitors, not limited thereto.

The power supplier 1240 may include the power supply apparatus 10 in FIGS. 1 to 3. The internal voltages VIS1 to VIS3 generated from the power supplier 1240 may be used as a power voltage of a circuit configured to receive the internal voltages.

The power connector 1103 may include various connectors in accordance with power supply types of the host device 1100.

Figure 6:
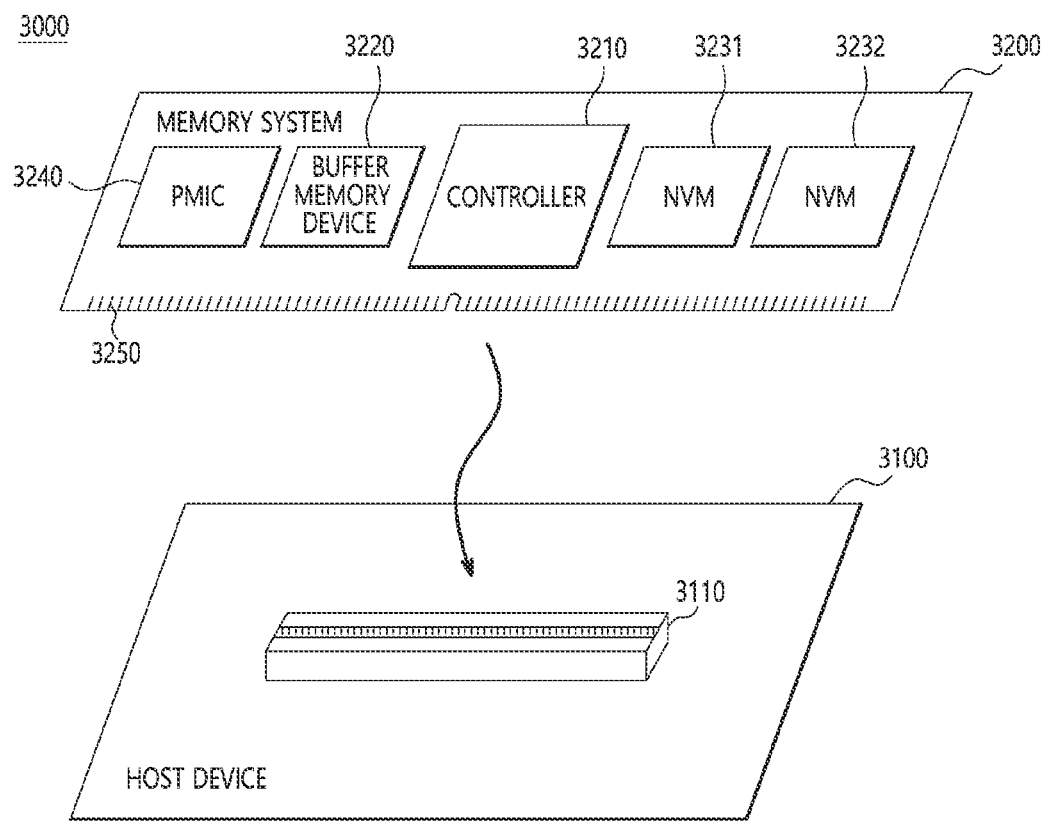
FIG. 6 and FIG. 7 are diagrams illustrating a data processing system in accordance with an embodiment of the present disclosure.

FIG. 6 is a diagram illustrating a data processing system 3000, in accordance with an embodiment of the present disclosure, Referring to FIG. 6, the data processing system 3000 may include a host device 3100 and a memory system 3200.

The host device 3100 may be configured in the form of a board, such as a printed circuit board. Although not shown, the host 2o device 3100 may include internal function blocks for performing the function of a host device.

The host device 3100 may include a connection terminal 3110, such as a socket, a slot, or a connector. The memory system 3200 may be mated to the connection terminal 3110.

The memory system 3200 may be configured in the form of a board, such as a printed circuit board. The memory system 3200 may be referred to as a memory module or a memory card. The memory system 3200 may include a controller 3210, a buffer memory device 3220, nonvolatile memory devices 3231 and 3232, a power management integrated circuit (PMIC) 3240, and a connection terminal 3250.

The controller 3210 may control general operations of the memory system 3200, The controller 3210 may be configured in the same manner as the controller 110 shown in FIGS. 1 and 2.

The buffer memory device 3220 may temporarily store data to be stored in the nonvolatile memory devices 3231 and 3232. Further, the buffer memory device 3220 may temporarily store data read from the nonvolatile memory devices 3231 and 3232. The data temporarily stored in the buffer memory device 3220 may be transmitted to the host device 3100 or the nonvolatile memory devices 3231 and 3232 according to control of the controller 3210.

The nonvolatile memory devices 3231 and 3232 may be used as storage media of the memory system 3200.

The PMIC 3240 may provide the power inputted through the connection terminal 3250 to the inside of the memory system 3200. The PMIC 3240 may manage the power of the memory system 3200 according to control of the controller 3210. The PMIC 3240 is configured as the power supply apparatus 10 described in FIG. 1 to FIG. 3

The connection terminal 3250 may be coupled to the connection terminal 3110 of the host device 3100, Through the connection terminal 3250, signals such as commands, addresses, data, and so forth, and power may be transferred between the host device 3100 and the memory system 3200.

The connection terminal 3250 may be configured as one or more of various types depending on an interface scheme between the host device 3100 and the memory system 3200. The connection terminal 3250 may be disposed on a side of the memory system 3200, as shown.

Figure 7:
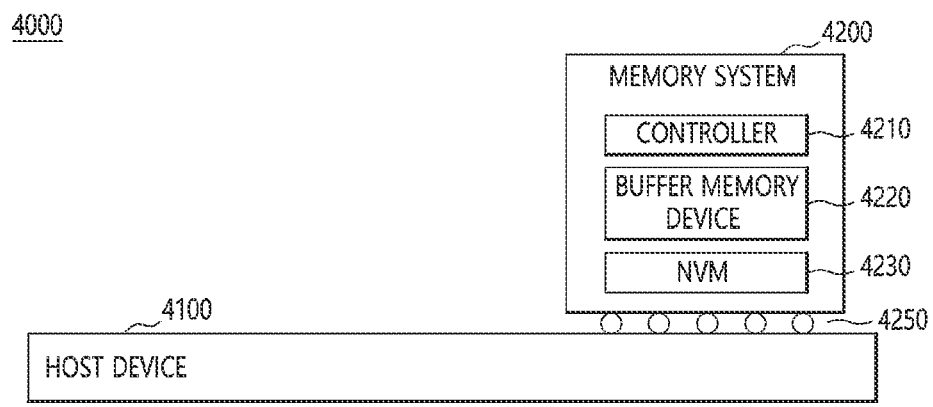

FIG. 7 is a diagram illustrating a data processing system 4000 in accordance with an embodiment of the present disclosure. Referring to FIG. 7, the data processing system 4000 may include a host device 4100 and a memory system 4200.

The host device 4100 may be configured in the form of a board, such as a printed circuit board. Although not shown, the host device 4100 may include internal function blocks for performing the function of a host device.

The memory system 4200 may be configured in the form of a surface-mounted type package. The memory system 4200 may be mounted to the host device 4100 through solder balls 4250. The memory system 4200 may include a controller 4210, a buffer memory device 4220, and a nonvolatile memory device 4230.

The controller 4210 may control general operations of the memory system 4200. The controller 4210 may comprise the power supply apparatus 10 described in FIG. 1 to FIG. 3.

The buffer memory device 4220 may temporarily store data to be stored in the nonvolatile memory device 4230. Further, the buffer memory device 4220 may temporarily store data read from the nonvolatile memory device 4230. The data temporarily stored in the buffer memory device 4220 may be transmitted to the host device 4100 or the nonvolatile memory device 4230 according to control of the controller 4210.

Figure 8:
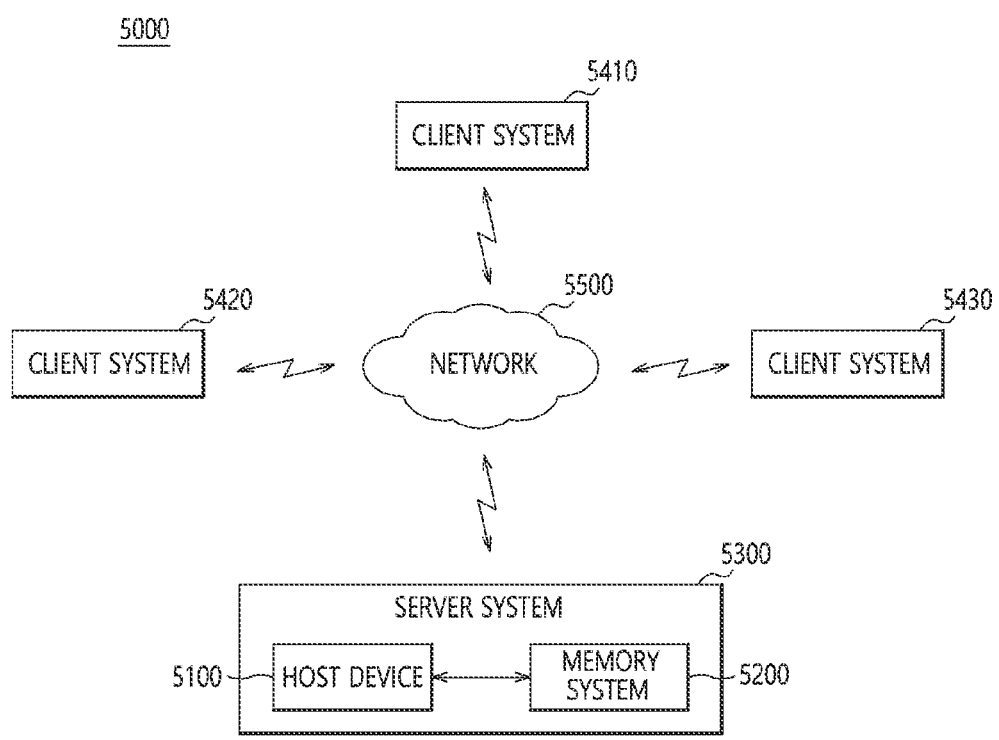
FIG. 8 is a diagram illustrating a network system including a data storage device in accordance with an embodiment of the present disclosure.

The nonvolatile memory device 4230 may be used as the storage medium of the memory system 4200, FIG. 8 is a diagram illustrating a network system 5000 including a data storage device, in accordance with an embodiment of the present disclosure, Referring to FIG. 8, the network system 5000 may include a server system 5300 and a plurality of client systems 5410, 5420, and 5430, which are coupled through a network 5500.

The server system 5300 may service data in response to requests from the plurality of client systems 5410 to 5430. For example, the server system 5300 may store the data provided by the plurality of client systems 5410 to 5430. As another example, the server system 5300 may provide data to the plurality of client systems 5410 to 5430.

The server system 5300 may include a host device 5100 and a memory system 5200. The memory system 5200 may comprise the power supply apparatus 10 described in FIG. 1 to FIG. 3.

Figure 9:
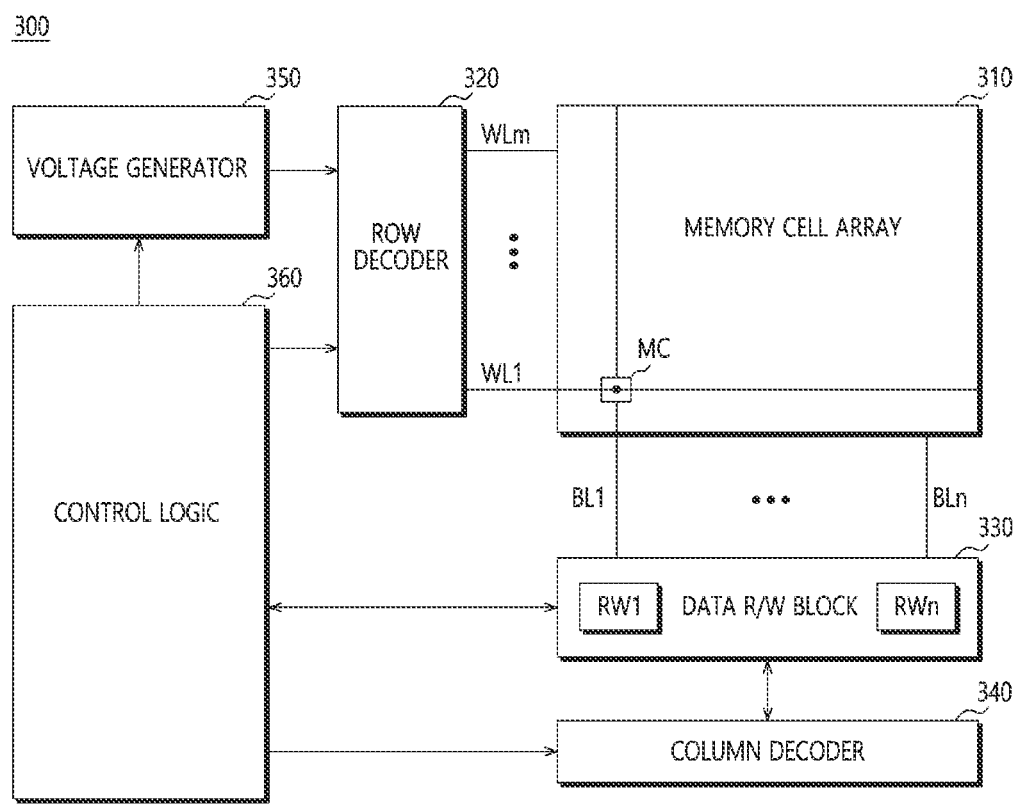
FIG. 9 is a block diagram illustrating a nonvolatile memory device included in a data storage device in accordance with an embodiment of the present disclosure.

FIG. 9 is a block diagram illustrating a nonvolatile memory device 300 included in a data storage device, such as the data storage device 10, in accordance with an embodiment of the present disclosure. Referring to FIG. 9, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The memory cell array 310 may comprise a three-dimensional memory array. The three-dimensional memory array, for example, has a stacked structure in a perpendicular direction to the flat surface of a semiconductor substrate. Moreover, the three-dimensional memory array means a structure including NAND strings which memory cells comprised in NAND strings are stacked perpendicular to the flat surface of a semiconductor substrate.

The structure of the three-dimensional memory array is not limited to the embodiment indicated above. The memory array structure can be formed in a highly integrated manner with horizontal directionality as well as vertical directionality. In an embodiment, in the NAND strings of the three-dimensional memory array memory cells are arranged in the horizontal and vertical directions with respect to the surface of the semiconductor substrate. The memory cells may be variously spaced to provide different degrees of integration The row decoder 320 may be coupled with the memory cell array 310 through the word lines WL1 to WLm. The row decoder 320 may operate according to control of the control logic 360. The row decoder 320 may decode an address provided by an external device (not shown). The row decoder 320 may select and drive the word lines WL1 to WLm, based on a decoding result. For instance, the row decoder 320 may provide a word line voltage, provided by the voltage generator 350, to the word lines WL1 to WLm.

The data read/write block 330 may be coupled with the memory cell array 310 through the bit lines BL1 to BLn. The data read/write block 330 may include read/write circuits RW1 to RWn, respectively, corresponding to the bit lines BL1 to BLn. The data read/write block 330 may operate according to control of the control logic 360. The data read/write block 330 may operate as a write driver or a sense amplifier, according to an operation mode. For example, the data read/write block 330 may operate as a write driver, which stores data provided by the external device in the memory cell array 310 in a write operation. For another example, the data read/write block 330 may operate as a sense amplifier, which reads out data from the memory cell array 310 in a read operation.

The column decoder 340 may operate according to control of the control logic 360. The column decoder 340 may decode an address provided by the external device. The column decoder 340 may couple the read/write circuits RW1 to RWn of the data read/write block 330, respectively corresponding to the bit lines BL1 to BLn, with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310, For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided by the external device. For example, the control logic 360 may control operations of the nonvolatile memory device 300 such as read, write, and erase operations of the nonvolatile memory device 300.

The above described embodiments of the present invention are intended to illustrate and not to limit the present invention. Various alternatives and equivalents are possible. The invention is not limited by the embodiments described herein, Nor is the invention limited to any specific type of semiconductor device. Other additions, subtractions, or modifications which are apparent in view of the present disclosure are intended to fall within the scope of the appended claims. Furthermore, the embodiments may be combined to form additional embodiments.

What is claimed is:

1. A power supply apparatus comprising:
a power management circuits configured to receive an external power voltage to generate an output voltage having a same level or different levels respectively;
a swatch circuit electrically connected between the power management circuits and output terminals, a number of the output terminals being less than a number of the power management circuits; and
a power controller configured to sequentially drive the power management circuits in accordance with a drive sequence, and control the switch circuit to apply, to the output terminals, the output voltage of a normally operated power management circuit as the driven power management circuit among the power management circuits.

2. The power supply apparatus of claim 1,
wherein the power controller is configured to sequentially drive the power management circuits by transmitting a target voltage level to a power management circuit to be driven among the power management circuits based on the drive sequence, and
wherein the output voltage corresponds to the target voltage level.

3. The power supply apparatus of claim 2, wherein the power controller is further configured to transmit an enable signal to the driven power management circuit, and determine whether the driven power management circuit is normally operated or not in accordance with a response signal from the driven power management circuit with respect to the enable signal.

4. The power supply apparatus of claim 1, wherein the power controller is configured to sequentially drive the power management circuits until the output voltage is applied to all output terminals.

5. The power supply apparatus of claim 1, wherein the power controller is configured to control the switch circuit in accordance with a normal operation of a previously driven power management circuit and a normal operation of a currently driven power management circuit as the power controller sequentially drives the power management circuits.

6. A method to supply power, the method comprising:
providing power management circuits, a number of the power management circuits being greater than a number of output terminals;
sequentially driving the power management circuits in accordance with a drive sequence;
generating an output voltage from a normally operated power management circuit as the driven power management circuit among the power management circuits; and
applying the output voltage to the output terminals.

7. The method of claim 6,
wherein the sequentially driving the power management circuits comprises transmitting, by a power controller, a target voltage level to a power management circuit to be driven among the power management circuits based on the drive sequence, and
wherein the output voltage corresponds to the target voltage level.

8. The method of claim 7, further comprising:
transmitting, by the power controller, an enable signal to the driven power management circuit; and
determining whether the driven power management circuit is normally operated or not in accordance with a response signal from the driven power management circuit with respect to the enable signal.

9. The method of claim 6, wherein the power management circuits are sequentially driven until the output voltage is applied to all output terminals.

10. The method of claim 6, further comprising:
determining, by the power controller, an output terminal to apply an output voltage of a current driven power management circuit in accordance with whether a previous driven power management circuit is normally operation and whether the current driven power management circuit is normally operation.

11. A data storage system comprising:
at least one memory device;
a controller configured to exchange data with the memory device in response to a request from an external device;
output terminals to which a plurality of internal circuits including the memory device and the controller are electrically connected; and
a power supply apparatus configured to sequentially drive power management circuits, which receives a power voltage from the external device to generate an output voltage having a same level or different levels respectively, and apply, to the output terminals, the output voltage of a normally operated power management circuit as the driven power management circuits, a number of the power management circuits being greater than a number of the output terminals.

12. The data storage system of claim 11,
wherein the power supply apparatus is configured to sequentially drive the power management circuits by transmitting a target voltage level to a power management circuit to be driven among the power management circuits based on the drive sequence, and
wherein the output voltage corresponds to the target voltage level.

13. The data storage system of claim 12, wherein the power supply apparatus is further configured to:
transmit an enable signal to the driven power management circuit; and
determine whether the driven power management circuit is normally operated or not in accordance with a response signal from the driven power management circuit with respect to the enable signal.

14. The data storage system of claim 11, wherein the power supply apparatus is configured to sequentially drive the power management circuits until the output voltage is applied to all output terminals.

15. The data storage system of claim 11, wherein the power supply apparatus determines an output terminal to apply an output voltage of a current driven power management circuit in accordance with whether a previous driven power management circuit is normally operation and whether the current driven power management circuit is normally operation.

* * * * *